(12) United States Patent
Blümel et al.

(10) Patent No.: US 7,665,861 B2
(45) Date of Patent: Feb. 23, 2010

(54) LED MODULE FOR ILLUMINATION SYSTEMS

(75) Inventors: Simon Blümel, Schierling (DE); Christian Hacker, Regensburg (DE); Andreas Stolzenberg, Sinzing (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/483,358

(22) PCT Filed: Jul. 9, 2002

(86) PCT No.: PCT/DE02/02510

§ 371 (c)(1), (2), (4) Date: Jun. 28, 2004

(87) PCT Pub. No.: WO03/007389

PCT Pub. Date: Jan. 23, 2003

(65) Prior Publication Data

US 2004/0240229 A1    Dec. 2, 2004

(30) Foreign Application Priority Data

Jul. 9, 2001 (DE) .................. 101 33 255

(51) Int. Cl.
   *F21V 21/00*  (2006.01)
(52) U.S. Cl. ............... 362/249; 362/248; 362/375; 362/267; 362/353
(58) Field of Classification Search ............ 362/249, 362/800, 267, 375, 248, 355, 353, 351
   See application file for complete search history.

(56) References Cited

U.S. PATENT DOCUMENTS

| 4,601,528 | A |   | 7/1986  | Spier |
| 5,038,255 | A | * | 8/1991  | Nishihashi et al. .......... 362/547 |
| 5,222,799 | A | * | 6/1993  | Sears et al. ................. 362/146 |
| D363,920  | S | * | 11/1995 | Roberts et al. ............. D13/182 |
| 5,607,227 | A | * | 3/1997  | Yasumoto et al. ...... 362/249.06 |

(Continued)

FOREIGN PATENT DOCUMENTS

DE    41 36 839 A    5/1993

(Continued)

OTHER PUBLICATIONS

Fischer U., "Sind Leuchtdioden bereits eine Alternative fur Leuchstoffrohren?" in Licht, pp. 282-287, Apr. 2001, Fortsetzung aus Licht Mar. 2001.

(Continued)

*Primary Examiner*—Jacob Y Choi
(74) *Attorney, Agent, or Firm*—Cohen Pontani Lieberman & Pavane LLP

(57) ABSTRACT

An LED module for illumination systems is provided that can be installed in and connected to an illumination system in a simple way both electrically and mechanically, and that ensures the greatest possible flexibility with reference to its possible uses. The LED module has a plurality of light-emitting diodes (2) arranged on a carrier plate (1), the carrier plate (1) being provided with at least one electrical connecting device (12) for electrically connecting the LED module, and with a fastening device (5) for fastening the LED module in an illumination system.

17 Claims, 3 Drawing Sheets

U.S. PATENT DOCUMENTS

| | | | |
|---|---|---|---|
| 5,632,551 A * | 5/1997 | Roney et al. | 362/485 |
| 5,765,940 A * | 6/1998 | Levy et al. | 362/240 |
| 5,848,837 A | 12/1998 | Gustafson | |
| 5,927,845 A * | 7/1999 | Gustafson et al. | 362/152 |
| 6,152,590 A * | 11/2000 | Furst et al. | 362/545 |
| 6,183,104 B1 * | 2/2001 | Ferrara | 362/145 |
| 6,283,612 B1 * | 9/2001 | Hunter | 362/240 |
| 6,347,880 B1 * | 2/2002 | Furst et al. | 362/494 |
| 6,422,716 B2 | 7/2002 | Henrici | |
| 6,441,943 B1 * | 8/2002 | Roberts et al. | 359/267 |
| 6,501,084 B1 * | 12/2002 | Sakai et al. | 250/504 R |
| 6,739,733 B1 * | 5/2004 | Lamke et al. | 362/646 |
| 6,739,735 B2 * | 5/2004 | Talamo et al. | 362/249 |
| 6,857,756 B2 * | 2/2005 | Reiff et al. | 362/184 |
| 6,902,308 B2 * | 6/2005 | Love | 362/545 |

FOREIGN PATENT DOCUMENTS

| | | |
|---|---|---|
| DE | 199 14 281 C1 | 3/1999 |
| DE | 100 12 734 C1 | 3/2000 |
| DE | 199 14 281 | 3/2000 |
| DE | 100 52 380 | 10/2000 |
| DE | 100 52 380 A1 | 10/2000 |
| EP | 1 107 389 A | 6/2001 |
| GB | 2 363 239 | 12/2001 |
| GB | 2 363 239 A | 12/2001 |
| JP | 03-101805 | 10/1991 |
| JP | 09-218931 | 8/1997 |
| JP | 2000-206912 | 7/2000 |
| JP | 2001-505705 | 4/2001 |
| WO | WO 99 53234 A | 10/1999 |

OTHER PUBLICATIONS

Examination Report dated May 29, 2002 issued for the corresponding German Application No. 101 33 255.6-33.

Office Action dated Dec. 12, 2007 issued for the corresponding Japanese patent application.

* cited by examiner

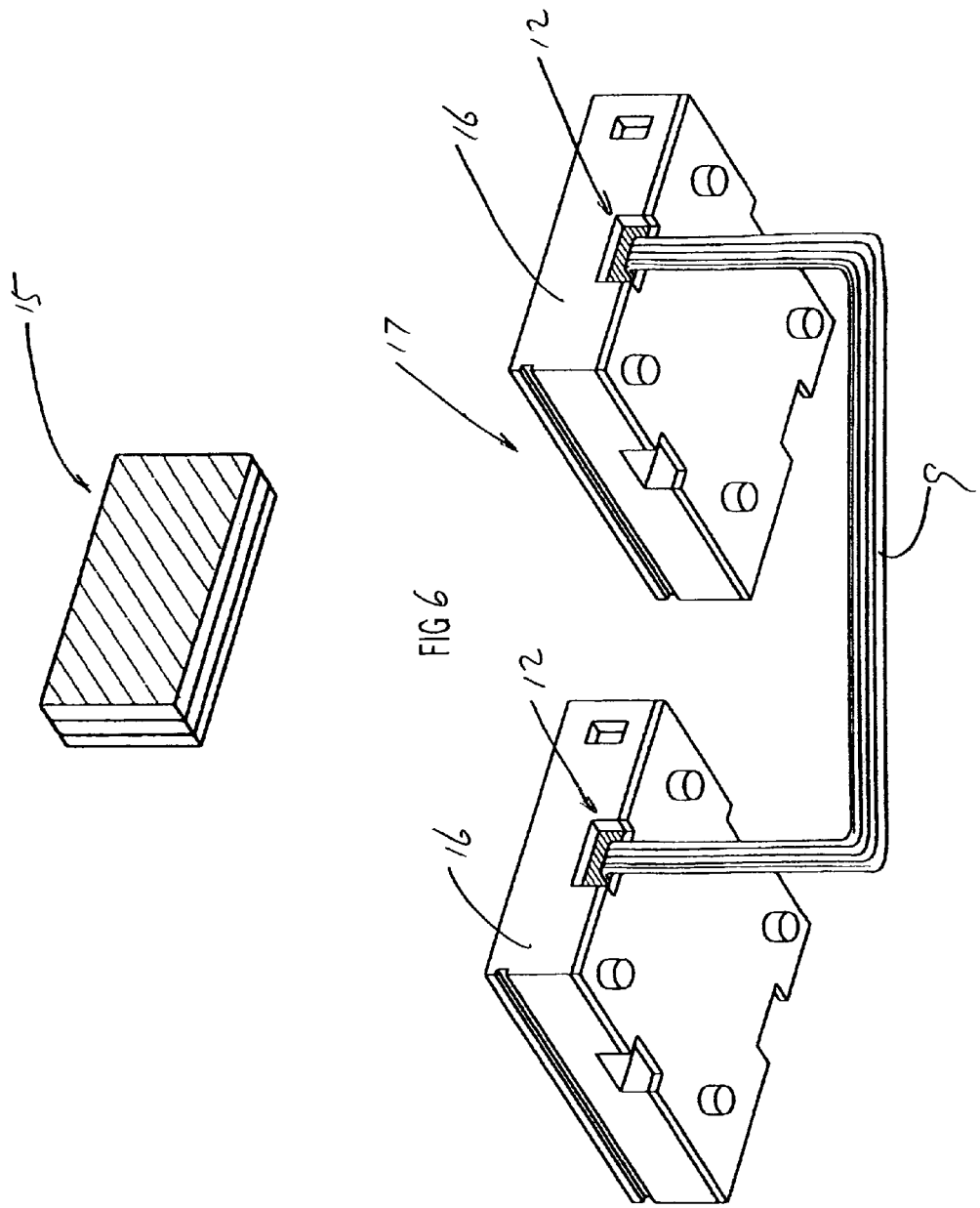

LED MODULE FOR ILLUMINATION SYSTEMS

This is a U.S. national stage of application No. PCT/DE02/02510, filed on 9 Jul. 2002.

BACKGROUND OF THE INVENTION

1. Field of the Invention

The present invention relates to an LED module for illumination systems in accordance with patent claim 1, and to illumination systems having such an LED module.

2. Description of the Related Art

It is customary to mount prefabricated illuminating means in a lumina housing when producing luminas. In practice, this approach makes use of the simplest possible illuminating means modules that can be assembled and installed in luminas without great technical know-how.

However, previously known illuminating means modules, which use light-emitting diodes ("LEDs") as illuminating means, require the lumina manufacturer to have special knowledge in the electrical and mechanical fields in order to insert the prefabricated LED modules into a lumina housing and connect them. Thus, for example, LED modules are known that have LEDs arranged on a carrier plate, it being possible for the carrier plate to be optionally broken into predetermined panels in order to be able to vary the module geometry. Electrical contact with the broken individual modules must subsequently be made via a soldered connection.

SUMMARY OF THE INVENTION

It is therefore an object of the present invention to provide an LED module for illumination systems that can be installed in and connected to an illumination system in a simple way both electrically and mechanically.

Another object is to provide an LED module having the greatest possible flexibility with reference to its possible uses.

These and other objects are attained in accordance with one aspect of the present invention directed to an LED module for illumination systems having a plurality of light-emitting diodes arranged on a carrier plate. The carrier plate has at least one electrical connecting device for electrical connection of the LED module, and a fastening device for fastening the LED module in an illumination system.

The LED module of the present invention has a plurality of light-emitting diodes arranged on a carrier plate, the carrier plate furthermore having at least one electrical connecting device for electrically connecting the LED module, and a fastening device for mechanically fastening the LED module in an illumination system. If a plurality of such LED modules are provided in an illumination system, the electrical connecting devices also serve for electrically interconnecting the individual LED modules, and the individual LED modules can also be mechanically interconnected via the fastening devices. During installation in an illumination system, the LED module according to the invention can be connected and/or fastened to the illumination system in a simple way by means of appropriately designed contact and fastening devices that engage in the electrical connecting devices and/or the fastening devices of the LED module. A large degree of flexibility is ensured at the same time when designing small LED modules, since a plurality of such LED modules can be combined virtually at will and in a simple way.

Electrically connecting the LED module for power supply and for driving the LED module is preferably performed via a plug-in connector that engages in a corresponding electric and mechanical contacting means of the electrical connecting device of the LED module. The plug-in connector in this case preferably has a means for tightly sealing the electrical connecting device in order to protect against environmental influences.

Furthermore, the LED module can have a housing that surrounds the light-emitting diodes arranged on the carrier plate and, possibly, further electronic components. Depending on application, this housing can satisfy various IP requirements with reference to its tightness.

A preferred exemplary embodiment of an LED module further has an optical system for influencing the emission characteristic of the light-emitting diodes. This optical system can be connected to the housing or integrated in the housing, or can also alternatively be connected to the carrier plate.

If not all the electrical connecting devices provided on the LED module are used during installation in an illumination system, these unused electrical connecting devices can be (tightly) sealed by means of suitable dummy plugs.

BRIEF DESCRIPTION OF THE DRAWINGS

The invention is explained in more detail below with the aid of a preferred exemplary embodiment and with reference to the attached drawings, in which:

FIG. 5 shows an exemplary dummy plug for tightly sealing unused electrical connecting devices of the LED module in accordance with the present invention; and FIG. 6 shows an exemplary illumination system including two LED modules that are electrically connected to each other.

DETAILED DESCRIPTION OF THE DRAWINGS

Figure 1:
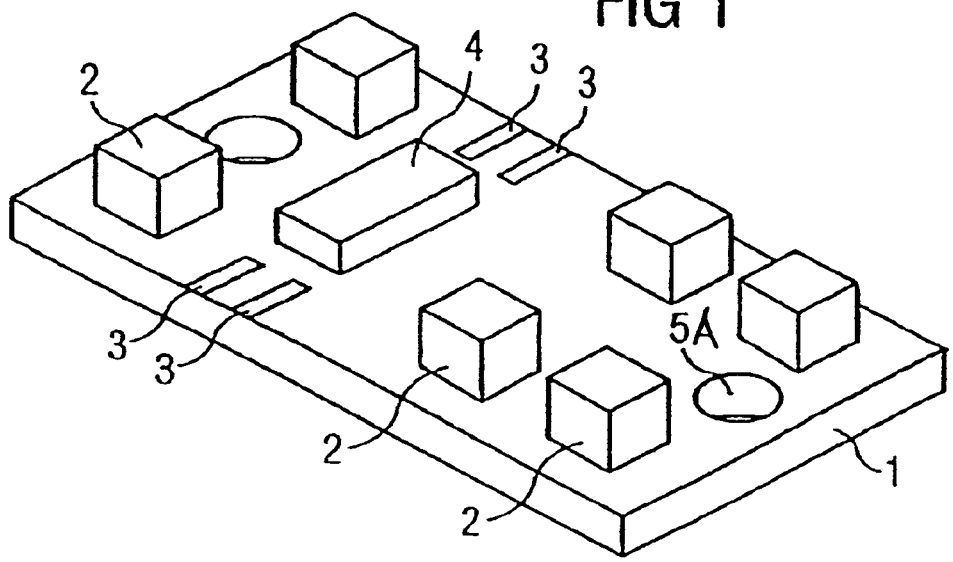
FIG. 1 shows a schematic of a carrier plate of an LED module in accordance with the present invention, in a perspective view from above.

FIG. 1 firstly illustrates a carrier plate 1 of an LED module in accordance with the present invention, in a schematic form. Arranged on the carrier plate 1 are a plurality of light-emitting diodes 2 and a control device 4 for driving the light-emitting diodes 2. The carrier plate 1 can be produced in principle from any desired material into which suitable conductor tracks and contact points are worked, or on which the latter are applied. Suitable materials are, for example, conventional circuit-board materials and modern plastics materials. Of course, in addition to the LEDs 2 and the control device 4, yet further electronic or optoelectronic components can also be mounted on the carrier plate 1. Moreover, the LEDs can also alternatively be driven externally such that the carrier plate 1 need not have a dedicated control device 4.

Electric contact devices 3 on the carrier plate 1 are used to supply energy to the LED module and feed control data. In the simplest case, this electric contact device 3 consists of only two contacts. However, more than two contacts are required for the electric contact device 3 for the purpose of separately driving individual LEDs or LED groups and/or their control devices 4, or for joint connection of a plurality of LED modules.

Figure 2:
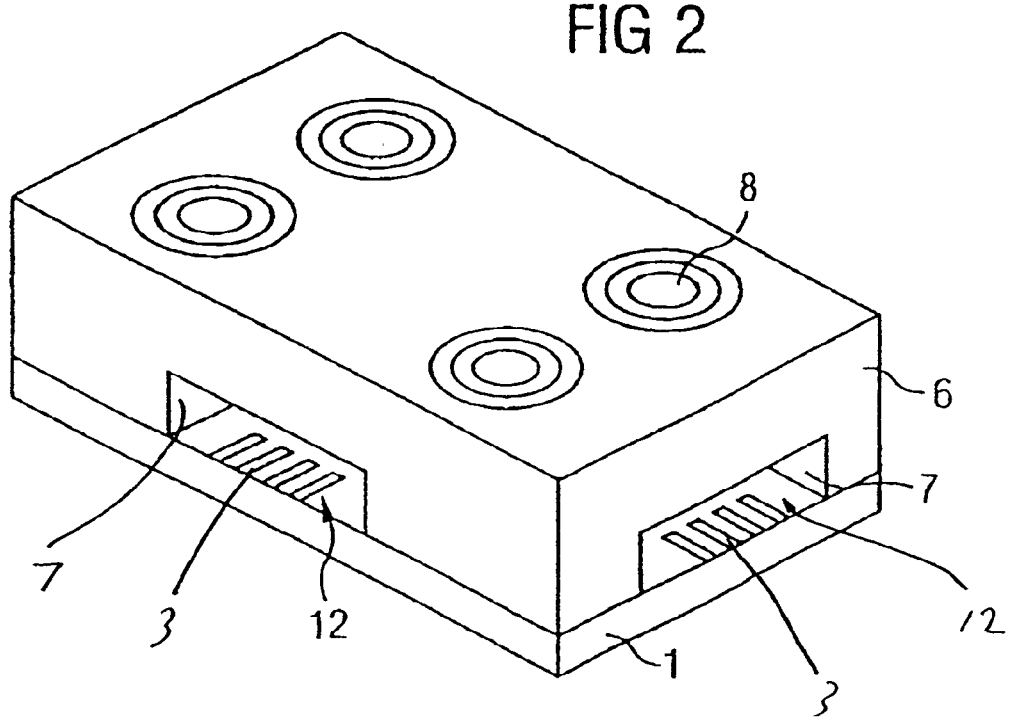
FIG. 2 shows a schematic of an LED module in accordance with the present invention, in a perspective view from above.

As illustrated in FIG. 2, together with a mechanical connection device 7, the electric contact device 3 forms the electrical connecting device 12 of the LED module. A plurality of such electrical connecting devices 12 are preferably provided at various points of the LED module, in order to ensure the greatest possible flexibility when connecting the LED module in an illumination system, or when interconnecting a plurality of LED modules.

The exemplary embodiment, shown in FIG. 2, of an LED module has a housing 6 that is applied to the carrier plate 1 and surrounds the LEDs 2 and the control device 4 on the carrier plate 1. Depending on the desired application of the LED module, the housing 6 can be designed to meet various tightness requirements such that the LED module can be adequately protected in unfavorable environmental conditions outside, or in regions of high air humidity. The housing 6 can be designed, for example, by embedding the carrier plate 1 with a suitable, preferably transparent, plastics material. In addition to, or instead of the tight embodiment of the housing 6, the LED module can also be provided with a protective coating, for example made from varnish.

Figure 3:
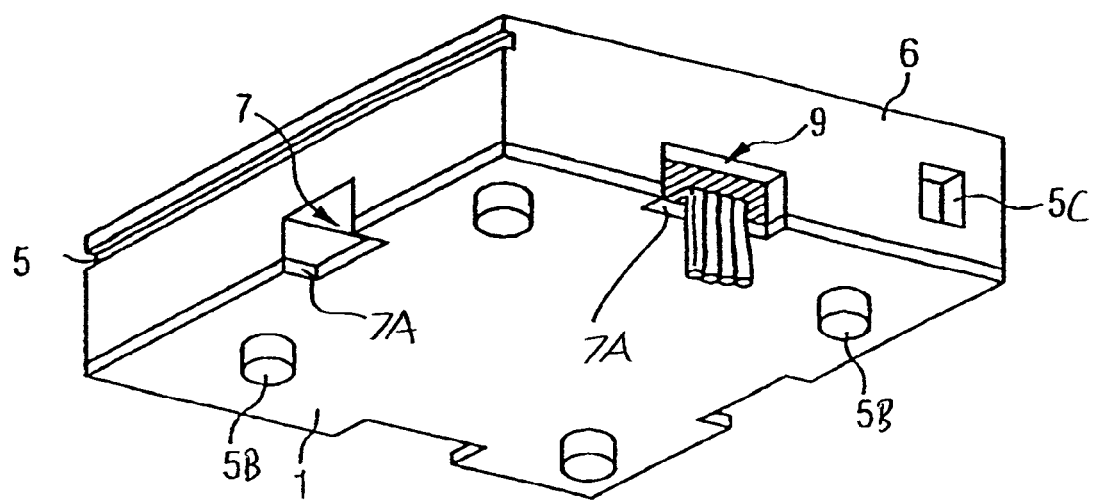
FIG. 3 shows a schematic of an LED module in accordance with the present invention, in a perspective view from below.
Figure 4:
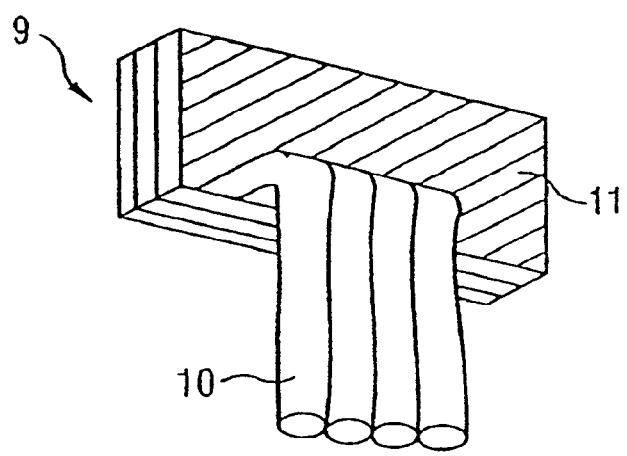
FIG. 4 shows a plug-in connector for electrically connecting an LED module in accordance with the present invention.

The mechanical connection device 7 of the electrical connecting device 12 is formed in the case of the exemplary embodiment illustrated in FIG. 2 by means of a recess in the housing that is provided at the electric contact device 3 on the carrier plate 1. The LED module is electrically connected in this case via a plug-in connector 9 which includes contacts (not shown) to engage contacts 3. Connector 9 has wires, or cables 10, extending therefrom, can be inserted into the recess 7 (as shown in FIG. 3) and is detachably fastened therein via a latching device (not illustrated). The plug-in connector 9 with its wires 10 is shown in FIG. 4. The manner of providing contacts in plug-in connector 9 for engagement with contact devices 3 on carrier plate 1 is a matter of design choice well within the capability of anyone with ordinary skill in the art. Therefore, further details thereof are not deemed necessary.

In order to maintain the tight encapsulation of the electronic components 2, 4 in the housing 6, the plug-in connector 9 can be provided with a means 11 for sealing the electrical connecting device 12, as shown in FIG. 4. This means 11 for sealing can be, for example, a circumferential sealing lip on the plug-in connector 9, whose outside dimensions are somewhat larger than the internal dimensions of the recess 7 of the electrical connecting device 12 on the LED module.

If a plurality of electrical connecting devices 12 are provided on an LED module, of which, for example, only one is used for connecting to the illumination system, it is possible to insert into the unused electrical connecting devices 12 suitable dummy plugs that tightly seal the electrical connecting devices 12 in order to maintain the tightness of the housing 6. An exemplary dummy plug 15 is shown in FIG. 5.

Instead of the embodiment of the electrical connecting device 12 shown in FIGS. 2 to 4, it is also alternatively possible to have a solderable connection on one end of wires 10 and a plug-in connector 9 at the other end. More specifically, the solderable connections are soldered on the electric contact device 3 of the carrier plate 1 and led out of the housing 6, preferably through a sealed bushing.

The electrical connecting devices 12 can also be used for electrically interconnecting a plurality of LED modules that are intended to be jointly installed in an illumination system. The electric connections thus executed serve both for supplying energy and for transmitting control data to the individual LED modules such that only one connection need be made from one of the plurality of LED modules to the illumination system.

In addition to the electrical connecting devices 12, the LED module also has at least one fastening device. As illustrated in FIG. 1, this fastening device can be, for example, a hole 5A in the carrier plate 1 into which one can press fit a pin 5B protruding from the underside of carrier plate 1 (see FIG. 3) to attach two LED modules to each other, or into which (in the case of a threaded hole) a screw (not shown) is screwed to attach the carrier plate 1 to the illumination system. However, other fastening devices are also conceivable, such as opening 5C in the wall of housing 6 shown in FIG. 3 through which a screw can be made to attach two illumination systems to each other. Thus, the fastening devices can be provided both on the carrier plate 1 and on the housing 6 connected to the carrier plate 1. The fastening devices can be designed as holes, threaded holes, pins, grooves (see 5D in FIG. 3), depressions and the like into which corresponding pins, screws, latching devices and the like engage, in order to fasten the LED module, preferably detachably, in an illumination system. The same fastening devices can likewise be used to connect a plurality of LED modules that are to be installed jointly in an illumination system.

FIG. 3 shows a notch 7A formed in carrier plate 1 at recess 7 formed in housing 6. Notch 7A has various benefits. For example, it protects wires 10 from being squeezed, and perhaps damaged, in case of a tight mechanical fitting of the LED-modules next to each other.

The optical system 8 can likewise comprise individual optical structures that are assigned in each case to one or more LED(s).

The manufacturer of illumination systems can easily fasten the above-described LED module in accordance with the present invention mechanically in an illumination system and connect it electrically via suitable plug-in connectors, for example. The electrical connecting device and the fastening device further provide the user with the option of easily combining a plurality of such LED modules in order to obtain a large degree of flexibility when fashioning the illumination systems.

An exemplary illumination system 17 is shown in FIG. 6. In the illumination system 17, two LED modules 16 are electrically connected to each other via their respective electrical connecting devices 12 by an electric plug-in connector 9.

Of course, the present invention is not limited to the above-described exemplary embodiment of an LED module that is illustrated in the figures, but rather it is possible to undertake some modifications without departing from the scope of protection defined by the claims. In particular, scarcely any limitations exist with reference to the shape, the size and the material of the LED module and its components. Again, the type and the arrangement of the electrical connecting devices and the mechanical fastening devices are not limited to the embodiments shown. Furthermore, it is possible in principle for any desired plug-in connectors or corresponding electrical connecting devices to be used.

The invention claimed is:

1. An LED module for an illumination system, the LED module comprising:
   a carrier plate embedded in a transparent plastics material;
   a plurality of light-emitting diodes arranged on the carrier plate; and
   an electronic control device mounted on the carrier plate for driving the plurality of light-emitting diodes;
   a housing surrounding the light-emitting diodes and having a housing surface remote from the light-emitting diodes; and an optical system integrally formed on the housing surface, the optical system having a beam-shaping or beam-deflecting contour that is not present on a remaining portion of the housing surface, wherein the plurality of light-emitting diodes and the electronic control device are mounted onto a same common surface of the carrier plate, wherein the carrier plate has at least one electrical connecting device for electrical connection of the LED module, and a fastening device for fastening the LED module in the illumination system, the electrical connecting device comprising more than two contacts, wherein individual ones of the light-emitting diodes or groups of the light-emitting diodes can be driven separately, wherein the electrical connecting device has an electric contact and a mechanical connection device such that the LED module is connectable to an electric plug-in connector via the electrical connecting device, and wherein the electric contact device and the mechanical connection device of the electrical connecting device are formed by a plug-in connector that is connected to the carrier plate via a cable connection.

2. The LED module as claimed in claim 1, wherein the mechanical connection device for the electrical connecting device is a recess into which the plug-in connector is operable to be inserted.

3. The LED module as claimed in claim 1, wherein the fastening device permits detachable fastening of the LED module to the illumination system.

4. An illumination system comprising a plurality of LED modules according to claim 1, wherein at least two of said plurality of LED modules are electrically interconnected to each other.

5. The illumination system as claimed in claim 4, wherein the plurality of LED modules are also mechanically interconnected via their respective fastening devices.

6. The illumination system as claimed in claim 4, further comprising dummy plugs for tightly sealing unused electrical connecting devices of the plurality of LED modules.

7. The illumination system as claimed in claim 4, wherein the at least two of said plurality of LED modules are electrically interconnected to each other via a plug-in connector.

8. The illumination system as claimed in claim 7, wherein said electric plug-in connector has means for sealing the electrical connecting devices of said at least two of the plurality of LED modules.

9. The LED module as claimed in claim 1, wherein said fastening device is of a detachable type for detachably fastening said LED module in the illumination system.

10. The LED module as claimed in claim 1, wherein said electrical connecting device is of a pluggable type.

11. The LED module as claimed in claim 1, wherein said electrical connecting device is of a detachable type.

12. The illumination system as claimed in claim 1, wherein the optical system comprises a plurality of discrete optical structures each corresponding to one of the plurality of light-emitting diodes.

13. The illumination system as claimed in claim 1, wherein the optical system is cast in one piece with the housing.

14. An illumination system comprising:
a plurality of LED modules, each of said plural LED modules comprising:
a carrier plate embedded in a transparent plastics material;
a housing for covering the carrier plate, the housing comprising a fastening device for fastening said each of said plural LED modules in the illumination system or for connecting at least two of said plural LED modules to each other;
a plurality of light-emitting diodes arranged on the carrier plate, said housing having a housing surface remote from the light-emitting diodes;
an electrical connecting device on the carrier plate for electrical connection of said plural LED modules in the illumination system, said electrical connecting device comprising an electric contact device and a mechanical connection device, said mechanical connection device being comprised of a recess formed in the housing; and
an optical system integrally formed on the housing surface, the optical system having a beam-shaping or beam-deflecting contour that is not present on a remaining portion of the housing surface,
wherein the at least two of said plural LED modules are electrically interconnected to each other via their respective electrical connecting devices by an electric plug-in connector which is inserted into the recesses of their respective electrical connecting devices.

15. The illumination system as claimed in claim 14, wherein the fastening device of the housing of one of said plural LED modules constitutes the associated counterpart to the fastening device of the housing of another of said plural LED modules, the electrical connecting device of said one of said plural LED modules constituting the associated counterpart to the electrical connecting device of said another of said plural LED modules.

16. The illumination system as claimed in claim 14, wherein the optical system comprises a plurality of discrete optical structures each corresponding to one of the plurality of light-emitting diodes.

17. The illumination system as claimed in claim 14, wherein the optical system is cast in one piece with the housing.

* * * * *